INVENTORS
YUICHI HANETA
KEIZO KOBAYASHI
BY
Hopgood & Calimafde
ATTORNEYS

INVENTORS
YUICHI HANETA
KEIZO KOBAYASHI
BY
Hopgood & Calimafde
ATTORNEYS

United States Patent Office 3,531,696

Patented Sept. 29, 1970

3,531,696

SEMICONDUCTOR DEVICE WITH HYSTERETIC CAPACITY VS. VOLTAGE CHARACTERISTICS

Yuichi Haneta and Keizo Kobayashi, Tokyo, Japan, assignors to Nippon Electric Company, Limited, Tokyo, Japan Filed Sept. 27, 1968, Ser. No. 763,152
Claims priority, application Japan, Sept. 30, 1967, 42/62,974; Aug. 22, 1968, 43/60,321
Int. Cl. H01l 3/12
U.S. Cl. 317—234 3 Claims

ABSTRACT OF THE DISCLOSURE

A semiconductor device of the metal insulator semiconductor type (MIS) is given an hysteretic capacitance vs. voltage characteristic by the provision of an insulative film on the semiconductor substrate of a silicon compound including liberated silicon of more than 0.5 percent by weight and a metal layer on the insulative film.

This invention relates to a semiconductor device of the so-called metal-insulator-semiconductor type (MIS), such as MIS diode, MIS transistor and MIS integrated circuit. Particularly, this invention relates to those MIS-type semiconductor devices which have hysteretic capacitance vs. voltage characteristics. The device of the invention may therefore be used as a memory device.

The hysteresis characteristics of the magnetic materials have so far been utilized to provide memory elements. It is impossible, however, to sufficiently miniaturize a memory device resorting to high integration of such memory elements, because of the leakage of magnetic flux.

The object of this invention is to provide a semiconductor device which has a hysteretic capacitance vs. voltage characteristics. The semiconductor device of this invention makes it possible to increase the density of memory elements in a memory device and thus to further miniaturize the memory device.

This invention is based on the discovery that the hysteretic capacitance vs. applied voltage characteristic is observed when a specific amount of impurities is introduced into a silicon oxide or silicon nitride insulative layer formed over a silicon substrate of the MIS-type semiconductor device. This is attributed to the unreciprocal change in the depletion region extending over the semiconductor surface.

Generally, the so-called MOS-type semiconductor devices such as MOS diode, MOS transistor and MOS integrated circuit resort to the electrons or the holes induced, by the voltage applied across the silicon dioxide film between the metal layer and semiconductor, in the silicon substrate just beneath the silicon-silicon oxide boundary plane. The MOS diode is described in order to facilitate an understanding thereof. The MOS-type semiconductor device utilizes silicon oxide film, having a thickness of several thousand angstrom and which is formed on a semiconductor surface, with a metal (for example, aluminum or gold) deposited on the film through the vaporization process. Through the process of forming the silicon oxide film over the silicon surface, electrons are brought to a state where they are easily induced in the semiconductor surface beneath the oxide film by the positive ions contained in the oxide film. In the case of an n-type transistor device, the silicon surface beneath the oxide film is in the accumulate state. Upon application of a negative voltage to the metal layer covering the diode film, the surface of the n-type semiconductor is turned to the depletion state and further to the inversion state, when the voltage is further lowered. When viewed in the capacitance vs. voltage characteristic, the capacitance shows a sudden drop at the applied voltage coming close to such voltage as forms the depletion region. A MOS diode utilizes this characteristic.

In the case of the usual MOS-type diode, however, the silicon dioxide layer formed through the heat oxidation process does not contain any impurity. Therefore, the hysteretic relation is not observed at room temperature between the applied voltage and the capacitance, even if the voltage applied to the metal layer is initially set at a value for forming the inversion region and then gradually raised. Similarly, no hysteretic characteristic is found, even when the voltage of the metal layer is first set at a positive value and then lowered gradually. It follows therefore that the usual MOS diode has no hysteretic nature in its capacitance vs. voltage characteristic.

Now, the invention will be described with reference to the accompanying drawings in which.

Figures 1, 2:
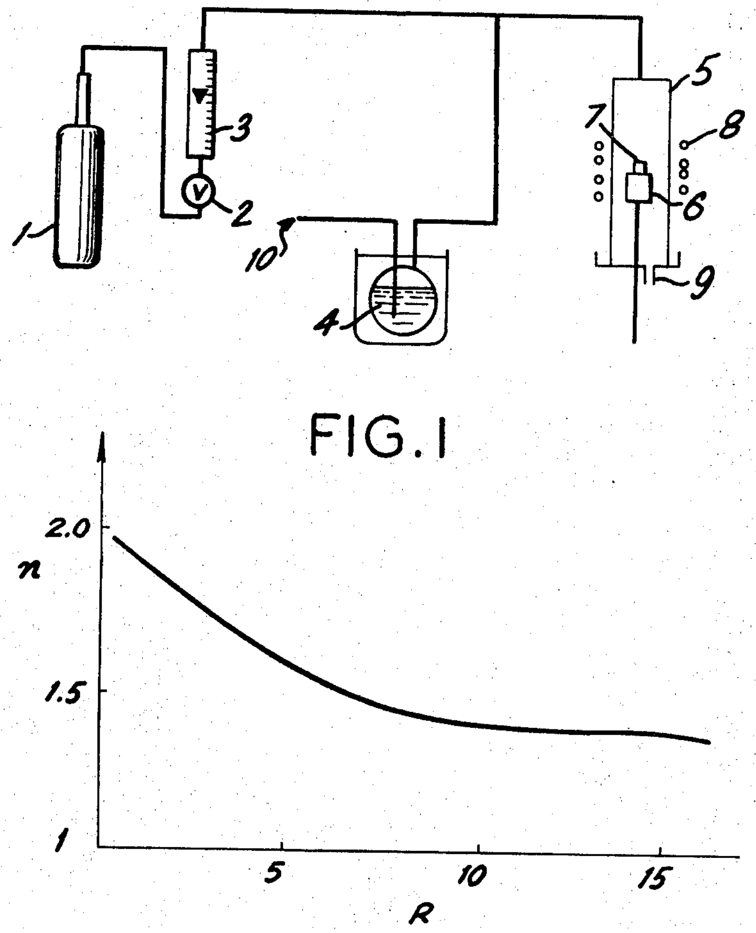
FIG. 1 is a schematic diagram illustrating an apparatus for forming a silicon compound film over a silicon substrate to manufacture the device of the invention.
FIG. 2 is a curve for explaining the process of manufacturing the device of this invention.

In FIG. 1, silane is led from a container 1 to a reactor 5 via a needle valve 2 and a flow meter 3. The flow rate of silane is controlled by the needle valve 2. On the other hand, hydrogen or argon gas is introduced as a carrier gas from the carrier gas inlet 10, caused to pass through pure water 4 and then introduced into the reactor 5 together with water vapor. Within the reactor 5, a semiconductor wafer (for example, silicon) is placed on a susceptor 6 and heated to a suitable temperature by a radio heating means 8.

Thus, silane and water vapor are put into a chemical reaction in the reactor 5 to form a silicon oxide film on the surface of the semiconductor 7. The residual gas is discharged from the vent 9 after the reaction is completed.

It has been empirically confirmed that the impurities are liberated within the silicon dioxide layer as a result of the simultaneous introduction of silane and water vapor and that the silicon oxide film thus formed has peculiar physical properties when the impurity ranges from 0.5 to 45 percent by weight.

FIG. 2 shows the change in the refractive index ($n$) of a silicon oxide film grown under the condition that the silicon substrate is maintained at 900° C. and the concentration of silane is widely changed with respect to the water vapor.

In case the ratio (R) of the water vapor volume (under 1 atmospheric pressure) to the silane volume is smaller than 10, the refractive index ($n$) increases with the decreases of the ratio R. However, the absorption peak at the wavelength of 9 microns is not changed. This is attributed to the stretching motion caused by infrared absorption among the silicon and oxygen atoms constituting silicon dioxide. It was thus found that the silicon dioxide film grown under the temperature of 900° C. and the above-defined volume ratio R smaller than 10 contains liberated silicon impurities. If the volume ratio R is maintained at 10, however, the silicon impurities in the silicon dioxide film is not substantially detected even with an X-ray microanalyzer. In contrast, 0.5 percent by weight silicon impurities was detected when the volume ratio R was equal to 5. Further experimental results revealed that the silicon impurities in the silicon oxide film is increased further when the volume ratio R is reduced. However, it should be noted here that the relation between the volume ratio R and the quantity of liberated silicon impurities is changed depending on the characteristics of the reactor 5.

Figure 3:
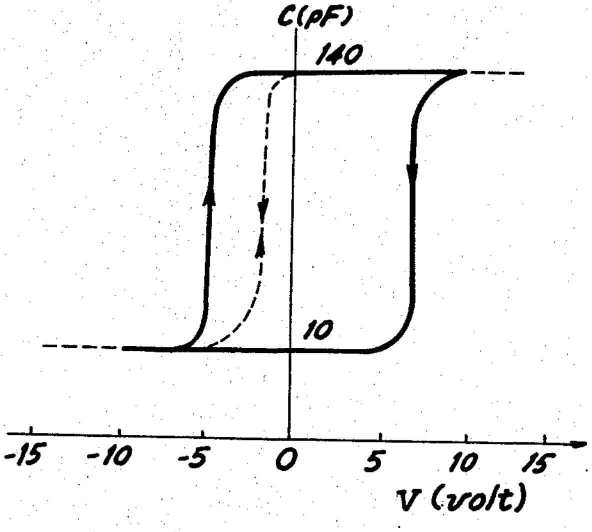
FIG. 3 shows a hysteretic capacitance vs. voltage characteristic curve observed with a diode of the first embodiment of the invention.

A MOS diode which is produced through the above-mentioned process and which has the silicon oxide film containing more than 0.5 percent by weight of silicon impurities exhibited a capacitance vs. voltage characteristics as shown in FIG. 3. In FIG. 3, the corresponding characteristic curve of the usual MOS-type diode is also plotted by the dotted line. As will be seen from FIG. 3, the distinct hysteretic nature is observed between the capacitance and the voltage applied to metal film with respect to the silicon substrate.

Figure 4:
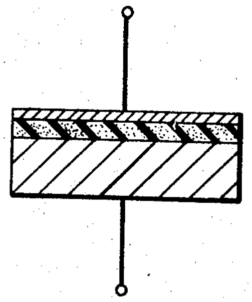
FIG. 4 is a cross sectional view of the first embodiment of this invention.

To clarify the points to which the voltage is to be applied to obtain the characteristic of FIG. 3, a cross-sectional view of the first embodiment is shown in FIG. 4. The silicon substrate is assumed to be a circular disc with the metal layer having the diameter of 1 millimeter. When the MOS diode has the silicon dioxide film of the thickness of 2,000 A. grown on the n-type (15Ω-cm.) silicon under the water vapor-silane volume ratio R of 3:1, the capacity observed across the two terminals at zero volt is 140 pf., when the metal layer was kept at −10 volt beforehand. In contrast, the same capacitance observed at zero volt is only 10 pf., when the metal film electrode was maintained at +10 volt beforehand. Thus, there are two distinct capacitance values for zero volt depending on the direction of the change of the voltage.

The series of experiments have so far revealed that a similar diode with a hysteresis characteristic is obtained even by introducing ammonia gas to the reactor 5 instead of water vapor. In this case, the silicon nitride film is formed to provide the so-called MNS-type semiconductor diode. Particularly, the MNS diode with the silicon nitride film containing silicon impurity ranging from 0.5 to 20 wt. percent shows remarkable hysteresis characteristics. For manufacturing the MNS diode, the apparatus of FIG. 1 is employed.

The reactor 5 is first evacuated. The ammonia contained in the ammonia water of container 4 is introduced by the carrier gas, which is supplied from inlet 10, to the reactor chamber 5. At the same time, silane is introduced from container 1. The silicon substrate 7 placed in the reactor chamber 5 is assumed to be an n-type silicon.

Resorting to this equipment, the silicon nitride film is formed on the substrate 7 at 750° C.–1,000° C. by setting the ammonia-silane volume ratio in the range of 50 to 500. Over the silicon nitride film, the metal film is formed through the evaporating process to complete the MNS diode.

Experimental results so far obtained through the X-ray microanlyzer show that the MNS diode containing 0.5 to 20 percent by weight silicon impurities has stable and remarkable hysteresis characteristics comparable to the first embodiment.

Figure 5:
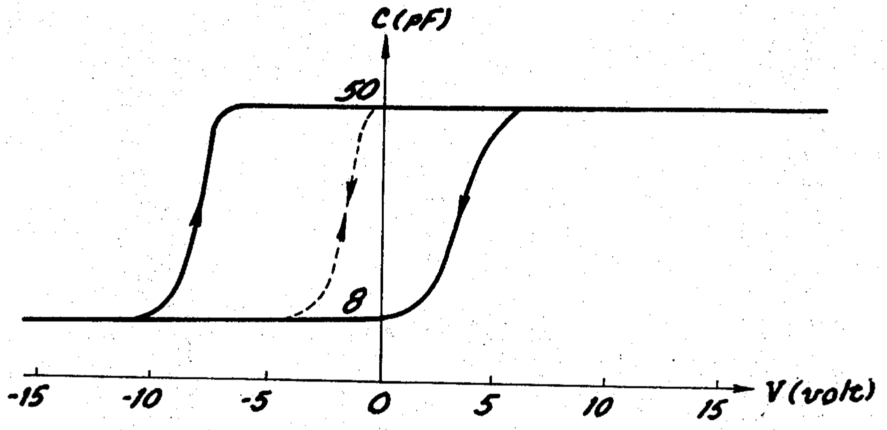
FIG. 5 shows the capacitance vs. voltage characteristics similar to FIG. 3 of a second embodiment.

FIG. 5 shows by thick line the hysteretic capacitance vs. voltage characteristics of the above-mentioned MNS diode of this embodiment. The curve in dotted line is the corresponding characteristic curve of the usual MOS diode for comparison purposes.

A sample MNS diode of this embodiment was manufactured as follows: Over the surface of an n-type silicon substrate of 30 ohm-cm., a silicon nitride film of the thickness of 2,000 A. was formed. The ammonia-silane volume ratio was set at 50 to 1. The diameter of the circular metal film was 0.4 mm.

The capacitance at zero volt of the sample was 50 pf. when the metal film electrode was maintained at −100 volt beforehand with respect to the silicon substrate. On the contrary, the capacitance at the same zero volt was 8 pf. when the metal electrode voltage was set at +100 volt beforehand. These experimental results prove the distinct capacitance vs. voltage characteristic of the MNS diode. This is probably attributed to the silicon liberated within the silicon nitride film and serving as the impurities.

Figure 6:
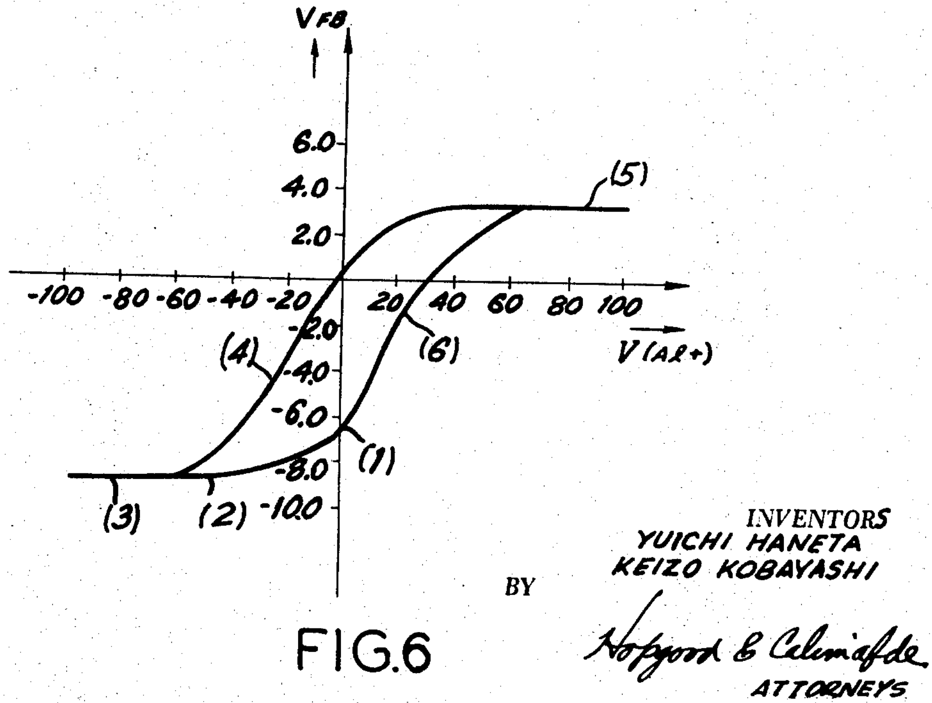
FIG. 6 shows a similar characteristic curve of a third embodiment of the invention.

Referring to FIG. 6, the hysteresis characteristics of above-mentioned MNS diode is traced in more detail. The reference numerals designating the steps of tracing correspond to those points on the hysteretic curve designated by the similar numerals. The plotting of the flat-band voltage ($V_{FB}$) defining the capacitance is as follows:

(1) Immediately after completion of the MNS diode, the $V_{FB}$ is −7 volts;

(2) Then the negative voltage is applied to the metal electrode layer and increased in its absolute value;

(3) In the voltage region lower than −60 volts, the voltage $V_{FB}$ becomes almost constant;

(4) Then, the negative voltage is gradually changed in the positive direction;

(5) Above +60 volt, $V_{FB}$ becomes constant again; and (6) The positive voltage is decreased, accompanying the decrease in the capacitance.

The hysteretic characteristics of the MNS diode have been repeatedly observed. It will be noted that the capacitance change is irreversible in the region of the voltage ranging from −60 volts to +60 volts, and reversible in the region of the voltage having absolute value beyond 60 volts.

To those skilled in the art, it would be easily conceivable that the hysteretic capacitance vs. voltage characteristics of the above-mentioned MOS and MNS diodes are utilized for a memory device. To describe a little more specifically, the existence of two distinct capacitance values for the zero volt terminal voltage can be assigned to the binary digits "1" and "0," respectively.

The reliability and durability of the present diode as a memory element is excellent, because the insulative layer is formed of the stable silicon dioxide or silicon nitride layers. Moreover the response to the applied voltage is quick enough, according to the experiments. Also, when the present device is used as the memory element, the density of the elements may be made sufficiently high without fear of mutual interference which is unavoidable with the conventional memory elements resorting to the magnetic hysteresis.

It would be apparent that this invention is not limited to the MIS (MOS or MNS) type semiconductor structure having one insulative layer between a metal film and a semiconductor substrate. Instead, the present structure is suitable also for the MIS structure having two or more combined multi-layers of insulator, such as the metal-nitride-oxide-semiconductor device.

What is claimed is:

1. A semiconductor device comprising:

a semiconductor substrate;

an insulative film on said substrate, said film being a silicon compound including liberated silicon of more than 0.5 percent by weight; and a metal layer on said insulative film: whereby the capacitance between said substrate and said metal layer exhibits a hysteretical change with a change in voltage between said substrate and said metal layer.

2. A semiconductor device claimed in claim 1, wherein said insulative film is silicon oxide including the liberated silicon within the range of 0.5 to 49 percent by weight.

3. A semiconductor device claimed in claim 1, wherein said insulate film is silicon nitride including the liberated silicon within the range of 0.5 to 20 percent by weight.

References Cited

UNITED STATES PATENTS

| | | | |
|---|---|---|---|
| 2,791,758 | 5/1957 | Looney | 317—235 X |
| 2,791,761 | 5/1957 | Morton | 317—235 X |

| | | | |
|---|---|---|---|
| 3,426,255 | 2/1969 | Heywang | 317—235 |
| 3,470,610 | 10/1969 | Breitweiser | 317—235 X |

JAMES D. KALLAM, Primary Examiner

U.S. Cl. X.R.

317—240